United States Patent [19]

Borel et al.

[11] 4,019,247
[45] Apr. 26, 1977

[54] FABRICATION OF A CHARGE-COUPLED DEVICE

[75] Inventors: Joseph Borel, Echirolles; Jacques Lacour, Grenoble; Gerard Merckel, Sassenage, all of France

[73] Assignee: Commissariat a l'Energie Atomique, Paris, France

[22] Filed: Jan. 2, 1975

[21] Appl. No.: 538,168

[30] Foreign Application Priority Data

Jan. 4, 1974 France .............................. 74.00294

[52] U.S. Cl. .................................. 29/578; 29/590; 357/24; 357/91
[51] Int. Cl.[2] ......................................... B01J 17/00
[58] Field of Search ............ 29/578, 580, 577, 590; 357/24, 91

[56] References Cited

UNITED STATES PATENTS

| 3,697,786 | 10/1972 | Smith | 357/24 |
| 3,739,237 | 6/1973 | Shannon | 357/91 |
| 3,796,932 | 3/1974 | Amelio | 357/91 |

Primary Examiner—W. Tupman
Attorney, Agent, or Firm—Cameron, Kerkam, Sutton, Stowell & Stowell

[57] ABSTRACT

The fabrication of a charge-coupled device consists in forming an insulating layer in the form of a periodic series of insulating steps, in depositing a metallic layer on alternate steps so as to form electrodes, in implanting regions doped with a type opposite to the substrate into the surface of the semiconductor by directing an ion beam through the insulating steps of small thickness which are transparent to the beam, and in connecting each electrode to a control line.

2 Claims, 4 Drawing Figures

FABRICATION OF A CHARGE-COUPLED DEVICE

This invention relates to a method of fabrication of a charge-coupled device and finds an application in electronics, especially in the construction of shift registers, delay lines, memory systems and so forth.

Charge-coupled devices (CCD) are semiconductor systems in which charges are stored in potential wells created at the surface of a semiconductor or at the interface between the semiconductor substrate and a surface region of different doping (the so-called "buried-channel devices") and in which these charges are transferred by displacing the potential wells. In very broad outline, these devices comprise a doped semiconductor substrate, a layer of insulating material and an array of metallic electrodes which are brought to suitable potentials. The charges displaced in devices of this type are minority carriers of the semiconductor substrate, for example the holes if the semiconductor is of the $n$ type.

For background information on the general properties of these charge-coupled devices, reference can be made to the two original articles published on this subject in the "Bell System Technical Journal", volume 49, 1970 and entitled respectively "Charge-coupled semiconductor devices" by W. S. Boyle and G. E. Smith (page 587) and "Experimental verification of the charge-coupled device concept" by G. F. Amelio, M. F. Tompsett and J. E. Smith (page 593).

In the first charge-coupled devices, three clocks were each connected by means of three control lines to one electrode out of three. These were followed by a proposed design of charge-coupled device having two control lines in which asymmetrical potential wells are created beneath the electrodes. By way of example, reference can be made to U.S. Pat. No. 3,829,844 filed January 13th, 1972 and to the article by W. F. Kosonocky and J. E. Carmes published in the IEEE Journal of Solid State Circuit, volume 6, No. 5, October, 1971 and entitled "Charge-coupled digital circuit".

In these devices having two control lines, the asymmetrical potential created beneath the electrodes is obtained either by means of a surface region which is more heavily doped beneath the upstream edge of the electrode than beneath the remainder of the electrode or by means of different thicknesses of oxide from one edge of the electrode to the other.

Charge-coupled devices have also been proposed in which only one control line is connected to all the electrodes. Relevant information on this subject can be found in the article by P. F. Gelberger and C. A. T. Salama published in "Proceedings of the IEEE" of June, 1972, page 721 and entitled "A uniphase charge-coupled device". Reference can also be made to French patent No. EN 7223408 filed in the name of Western Electric on June 28th, 1972 in respect of "Charge-coupled device". In the document just cited, the means for ensuring unidirectionality of transfer from one electrode to the other in the charge-coupled device comprise doped regions localized in the semiconductor substrate and between the electrodes, said means being associated with variations in oxide thickness, for example.

The present invention has for its object a method of fabrication of charge-coupled devices and especially devices having a single control line and devices having two control lines. The essential feature of the invention consists in constructing the device in two stages: the initial stage consists in depositing on a semiconductor substrate the means for controlling the depth of the potential wells, for example insulating deposits having periodic variations in thickness and in some cases metallic layers constituting the electrodes. The second stage consists in forming doped regions by ion implantation through the structure previously formed and employed as a mask. This method is therefore particularly simple and wholly compatible with the technology which is usually employed in the fabrication of MOS structures. The relative positioning on the one hand of the doped regions and on the other hand of the insulating regions having different thicknesses and of the electrodes is carried out automatically.

The method according to the invention permits a number of alternative forms, depending on whether the deposition of the metallic layer which serves to form the electrodes is performed prior to the ion implantation operation or after this latter and depending on whether it is desired to obtain a device having either one control line or two control lines.

The scope of this invention includes all the forms of construction in accordance with the so-called "buried channel" technique, that is to say in which provision is made for a doped surface region of the type opposite to that of the substrate.

The characteristic features and advantages of the method according to the invention will in any case be more clearly brought out by the following description of alternative forms which are given by way of explanation and not in any sense by way of limitation, reference being made to the accompanying drawings, wherein.

In the following description, it will be postulated only by way of explanation that use is made of an n-type substrate composed of silicon, for example, in which the minority carriers are therefore holes. The surface regions of the substrate in which the doping is opposite to that of said substrate are therefore p-type regions. It is nevertheless evident to any one versed in the art that it would not constitute any departure from the scope of the invention to employ a p-type substrate and an n-type surface region.

Figure 1:
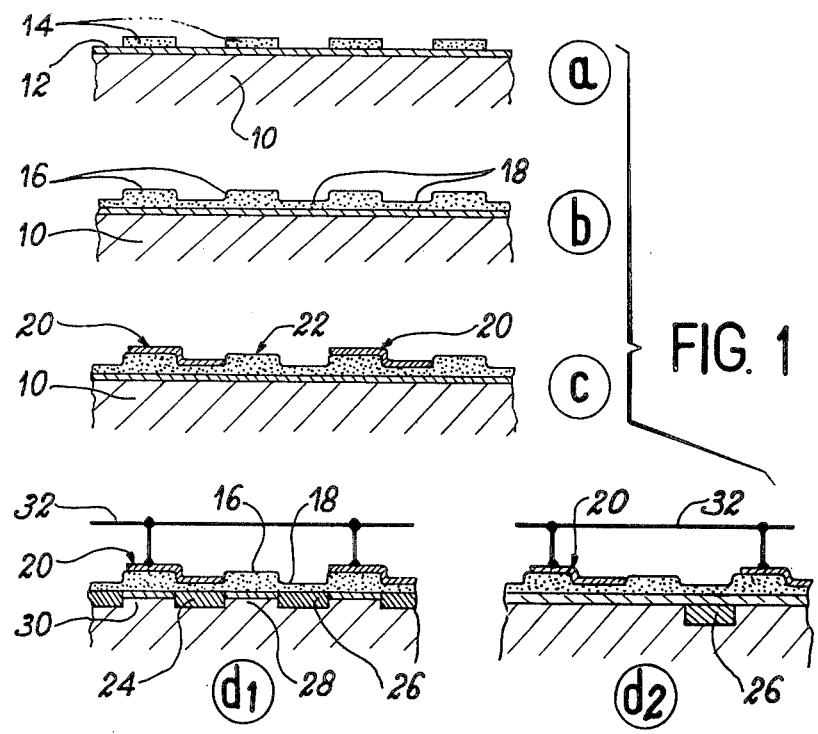
FIG. 1 is a schematic diagram showing the different stages of a method of fabrication of a charge-coupled device having a single control line with doped regions beneath the electrodes and/or within the interelectrode space.

FIG. 1 shows diagrammatically the different stages of the method of fabrication of a charge-coupled device having one control line in accordance with a first variant. This method comprises the following successive operations: deposition by ion implantation especially with boron of a uniform p-type layer designated by the reference 12 and having a thickness, for example, of 0.3 $\mu$m or more on an n-type semiconductor designated by the reference 10 and formed of silicon, for example.

This surface compensation has the effect of burying the channel in which the minority carriers travel, thus reducing recombinations at the surface and improving the performances at low and high frequencies;

formation of a thin insulating layer by oxidation (for example 1000 A of $SiO_2$) followed by localized etching in order to leave only a series of pads 14; there is then obtained a device in accordance with the diagram of stage a;

reoxidation in order to have two thicknesses of oxide, for example 1000 A and 3000 A, thus giving rise to a periodic sequence of insulating steps sucessively of substantial thickness (steps 16) and of small thickness (steps 18) (stage b);

deposition of a metallic layer, for example of aluminum having a thickness of 1000 A, followed by etching in order to leave only the electrodes 20; these electrodes are separated by a space 22 consisting of two consecutive steps respectively of substantial and small thickness which are not covered with metallic layers (stage c);

p-type ion implantation by means of an ion beam whose energy is such that the layer formed by the insulating layer 2 of small thickness and the metallic layer 20 are transparent to said beam, which permits implantation of the p-type regions 24 beneath the electrodes and, even more so, the regions 26 located in the interelectrode space and having an energy such that the insulating layer 16 of substantial thickness is opaque to said beam, thereby preserving the regions 28 in the interelectrode space and, even more so, the regions 30 beneath the electrodes; (stage $d_1$);

each electrode 20 is then connected to a single control line 32.

This mode of execution gives rise to a technological difficulty in forming a metallic electrode which is transparent to p-type implantation in order to obtain a slight increase in the potential well beneath the electrodes. It is possible to abandon this increase and to employ conventional electrode thicknesses of one micron for example which are opaque to the p-type implantation, thereby appreciably simplifying the fabrication process: the regions 24 thus disappear from the completed device and only the regions 26 appear within the interelectrode space (stage $d_2$); beneath the electrodes, only the variation in thickness of oxide creates the asymmetrical potential.

Figure 2:
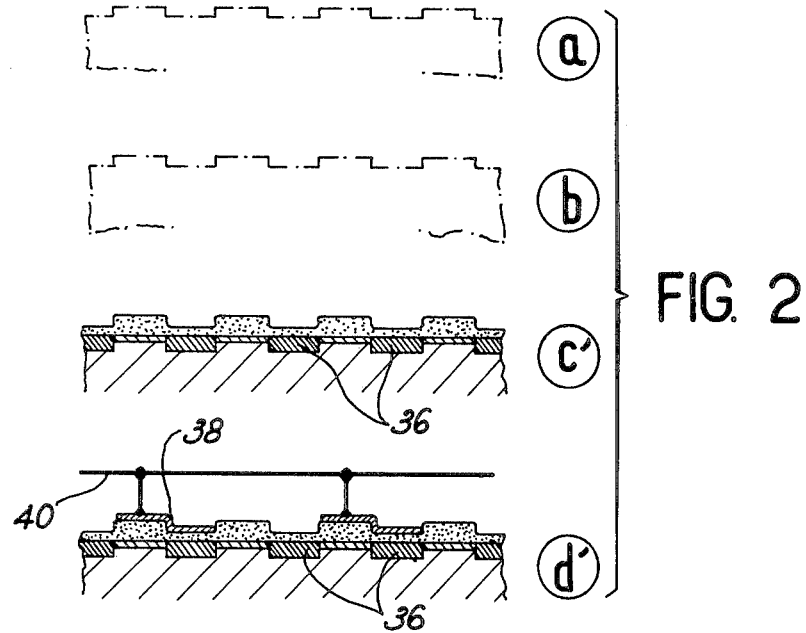
FIG. 2 shows a variant of the above method in which deposition of the electrodes is performed after the ion implantation operation.

FIG. 2 shows a variant of the method of fabrication in which stages a and b are the same as in the method of FIG. 1 but in this variant, the operation of ion implantation is carried out prior to the metal deposition which is intended to form the electrodes. This implantation makes it possible to obtain the device shown in stage c' in FIG. 2, in which the p-type regions 26 are identical. The metal deposition and etching are then carried out and result in the formation of the electrodes 38 which are connected to the single control line 40.

Figure 3:
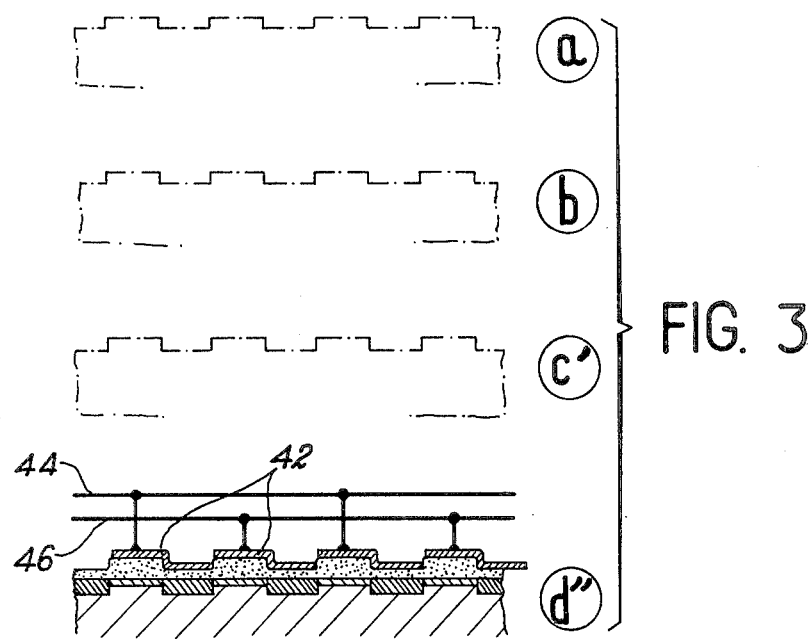
FIG. 3 is a schematic diagram showing the different stages of a variant of the method of fabrication of a charge-coupled device having two control lines.

FIG. 3 shows another variant in which a device having two control lines is obtained after stage c' of FIG. 2. To this end, the metal deposit is etched in order to obtain a series of electrodes 42, one out of two electrodes being connected to a first control line 44 whilst the others are connected to a second control line 46 (stage d'').

It is wholly apparent that a device having two control lines can also be constructed by means of a method which is deduced from that of FIG. 1. Thus a metal deposit is formed with the product shown after stage b of FIG. 1 and etched as in FIG. 3 in order to obtain a series of electrodes, whereupon implantation is performed under the same conditions as in FIG. 1 (stage $d_1$); finally, one electrode out of two is connected to a first control line and the others are connected to a second control line.

Figure 4:
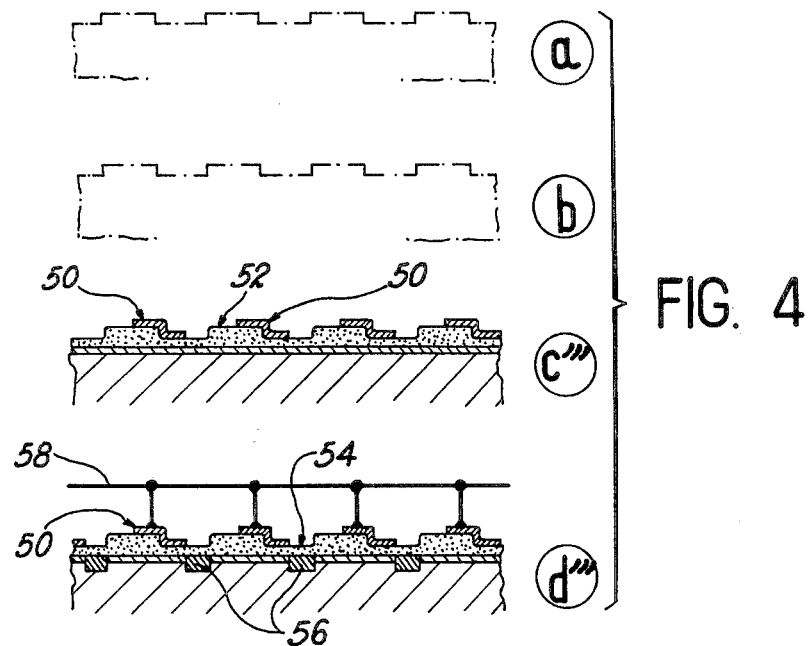
FIG. 4 is a schematic diagram showing the different stages of a method for obtaining a charge-coupled device having a single control line with implantation of doped regions solely within the interelectrode space.

The variant which is illustrated in FIG. 4 makes it possible to obtain a device having one control line; this variant involves operation a and b which are common to all the variants described in the foregoing but is continued by a stage of etching of the metal deposit which consists in allowing this layer to remain only on a part of the steps of substantial thickness and on a part of the steps of small thickness. There is thus formed a series of electrodes 50 separated by an interelectrode space 52 constituted by the portions of insulating steps which are not covered with metallic layers (stage c'''). In accordance with the essential feature of the invention, the ion implantation is carried out by employing the structure thus obtained as a mask and be regulating the energy of the ion beam in such a manner as to ensure that only the portions 54 on the insulating steps of small thickness not covered with the metallic layer are transparent to said ion beam; this makes it possible to implant n-type regions 56 into the substrate. The method is completed by connecting the electrodes 50 to a single control line 58.

It is apparent from the foregoing description of these different variants that the method according to the invention which consists in making use of the insulating structure (and if necessary the metallic layer associated therewith) formed on the substrate in the first stage as a mask in the ion implantation operation is particularly simple and makes it possible to obtain charge-coupled devices having high performances and small overall size.

We claim:

1. A method of fabrication of a charge-coupled device having one control line the steps of forming an insulating layer of a periodic series of insulating steps successively of substantial thickness and of small thickness on a doped semiconductor substrate, depositing a metallic layer on alternate steps of substantial thickness and on the adjacent step of small thickness thus forming a series of electrodes separated by a space of two consecutive steps not covered with a metallic layer, one of said consecutive steps being of substantial thickness and the other of said consecutive steps being of small thickness.

implanting doped regions of a doping type opposite to that of the doped substrate into the surface of the semiconductor by directing an ion beam upon said steps and electrodes, said steps and electrodes being employed as a mask in such a manner that the insulating steps of substantial thickness which are not covered with said metallic layer are opaque to the ion beam and that the insulating steps of small thickness which are not covered with said metallic layer are transparent to said ion beam, and connecting each electrode to a control line.

2. A method according to claim 1, wherein the steps of small thickness which are covered with said metallic deposit are also transparent to said ion beam.

* * * * *